(12) United States Patent
Kim

(10) Patent No.: US 9,997,494 B2
(45) Date of Patent: Jun. 12, 2018

(54) THREE-DIMENSIONAL SILICON STRUCTURE FOR INTEGRATED CIRCUITS AND COOLING THEREOF

(71) Applicant: Gerald Ho Kim, Carlsbad, CA (US)

(72) Inventor: Gerald Ho Kim, Carlsbad, CA (US)

( * ) Notice: Subject to any disclaimer, the term of this patent is extended or adjusted under 35 U.S.C. 154(b) by 0 days. days.

(21) Appl. No.: 14/499,169

(22) Filed: Sep. 27, 2014

(65) Prior Publication Data

US 2015/0091156 A1   Apr. 2, 2015

Related U.S. Application Data

(60) Provisional application No. 61/883,966, filed on Sep. 27, 2013.

(51) Int. Cl.

| | | |
|---|---|---|
| *H01L 23/367* | (2006.01) | |
| *H01L 23/373* | (2006.01) | |
| *H01L 23/522* | (2006.01) | |
| *H01L 25/065* | (2006.01) | |
| *H01L 23/427* | (2006.01) | |
| *H01L 29/06* | (2006.01) | |
| *H01L 23/467* | (2006.01) | |
| *H01L 23/48* | (2006.01) | |

(52) U.S. Cl.
CPC ...... *H01L 25/0657* (2013.01); *H01L 23/3672* (2013.01); *H01L 23/3738* (2013.01); *H01L 23/427* (2013.01); *H01L 23/4275* (2013.01); *H01L 29/0657* (2013.01); *H01L 23/467* (2013.01); *H01L 23/481* (2013.01); *H01L 2225/06541* (2013.01); *H01L 2225/06589* (2013.01); *H01L 2924/0002* (2013.01)

(58) Field of Classification Search
CPC ....... H01L 2224/16; H01L 2924/01079; H01L 2224/73253; H01L 23/473; H01L 2924/15311; H01L 23/3672; H01L 23/3738; H01L 23/427; H01L 23/4275; H01L 29/0657
See application file for complete search history.

(56) References Cited

U.S. PATENT DOCUMENTS

| | | | | |
|---|---|---|---|---|
| 2006/0197181 | A1* | 9/2006 | Noguchi | H01L 23/3677 257/530 |
| 2007/0126116 | A1* | 6/2007 | Dangelo | B82Y 10/00 257/720 |
| 2010/0139904 | A1* | 6/2010 | Chiba | H01L 21/4878 165/185 |
| 2010/0187683 | A1* | 7/2010 | Bakir | H01L 23/3677 257/713 |
| 2012/0182693 | A1* | 7/2012 | Boday | C09K 5/14 361/713 |
| 2013/0217188 | A1* | 8/2013 | Wang | H01L 21/563 438/118 |
| 2013/0270721 | A1* | 10/2013 | Chiriac | H01L 23/4275 257/796 |

* cited by examiner

*Primary Examiner* — Allen Parker
*Assistant Examiner* — Long H Le
(74) *Attorney, Agent, or Firm* — Andy M. Han

(57) ABSTRACT

Embodiments of a three-dimensional silicon structure for integrated circuits and cooling thereof are described. In one aspect, a device includes a silicon substrate having a first primary side and a second primary side opposite the first primary side. The first primary side includes a circuit structure disposed thereon. The second primary side includes a plurality of fins monolithically formed thereon.

15 Claims, 11 Drawing Sheets

THREE-DIMENSIONAL SILICON STRUCTURE FOR INTEGRATED CIRCUITS AND COOLING THEREOF

CROSS REFERENCE TO RELATED PATENT APPLICATION

The present disclosure claims the priority benefit of U.S. Patent Application No. 61/883,966, filed on 27 Sep. 2013, which is incorporated by reference in its entirety.

TECHNICAL FIELD

The present disclosure generally relates to the field of transfer of thermal energy and, more particularly, removal of thermal energy from silicon-based integrated circuits.

BACKGROUND

There are many applications, ranging from consumer electronics to telecommunications and the like, in which semiconductor-based integrated circuits capable of performing various tasks are packed in close proximity in a small form factor to serve various needs. Such integrated circuits may include, for example, driver circuits, microprocessors, graphics processors, memory chips, global positioning system (GPS) chips, communications chips, laser diodes including edge-emitting lasers and vertical-cavity surface-emitting lasers (VCSELs), light-emitting diodes (LEDs), photodiodes, sensors, etc. Integrated circuits inevitably generate thermal energy, or heat, in operation and thus are heat sources during operation as well as for a period of time after power off. As the number and complexity of the functionalities performed by integrated circuits continue to increase, heat generated by integrated circuits, as heat sources, present technical challenges that need to be addressed. For one thing, performance, useful lifespan, or both, of an integrated-circuit chip may be significantly impacted if the heat generated by the integrated-circuit chip is not adequately dissipated or otherwise removed from the chip.

Metal heat sinks or radiators, based on copper or aluminum for example, have been a dominant heat sink choice for electronics and photonics applications. However, as the form factor of integrated circuits gets smaller it is impractical to build a small metal heat sink with a large surface area heat sink.

SUMMARY

Various embodiments disclosed herein pertain to a technique, design, scheme, device and apparatus related to a three-dimensional silicon structure for integrated circuits and cooling thereof.

In one aspect, a device may include a silicon substrate. The silicon substrate may have a first primary side and a second primary side opposite the first primary side. The first primary side may include a circuit structure disposed thereon. The second primary side may include a plurality of fins monolithically formed thereon.

In at least one embodiment, at least a portion of the circuit structure may be configured to function as a memory unit, a central processing unit, a graphics processing unit, a navigation unit, a communication unit, or a radio frequency unit.

In at least one embodiment, the circuit structure may include one or more electrical traces or a semiconductor structure of an integrated circuit.

In at least one embodiment, the device may further include a plurality of vias formed in the silicon substrate and configured to provide electrical connection to the circuit structure. The vias may include: a plurality of through holes connecting the first primary side and the second primary side of the silicon substrate; and an electrically-conductive material filled in the through holes and in contact with the circuit structure.

In at least one embodiment, at least some of the vias may be formed along at least one peripheral side of the silicon substrate.

In another aspect, an apparatus may include a first semiconductor device and a second semiconductor device. The first semiconductor device may include a first silicon substrate having a first primary side and a second primary side opposite the first primary side. The first primary side of the first silicon substrate may include a first circuit structure disposed thereon. The second primary side of the first silicon substrate may include a plurality of first fins monolithically formed thereon. The second semiconductor device may include a second silicon substrate having a first primary side and a second primary side opposite the first primary side. The first primary side of the second silicon substrate may include a second circuit structure disposed thereon. The second primary side of the second silicon substrate may include a plurality of second fins monolithically formed thereon. The first semiconductor device may be stacked on the second semiconductor device with the first primary side of the first silicon substrate facing the second primary side of the second silicon substrate.

In at least one embodiment, a portion of at least the first circuit structure or the second circuit structure may be configured to function as a memory unit, a central processing unit, a graphics processing unit, a navigation unit, a communication unit, or a radio frequency unit.

In at least one embodiment, at least the first circuit structure or the second circuit structure may include one or more electrical traces or a semiconductor structure of an integrated circuit.

In at least one embodiment, the first semiconductor device and the second semiconductor device may be bonded by solder bonding or epoxy bonding.

In at least one embodiment, the apparatus may further include a plurality of first vias formed in the first silicon substrate and configured to provide electrical connection to the first circuit structure. The first vias may include: a plurality of first through holes connecting the first primary side and the second primary side of the first silicon substrate; and a first electrically-conductive material filled in the first through holes and in contact with the first circuit structure.

In at least one embodiment, at least some of the first vias may be formed along at least one peripheral side of the first silicon substrate.

In at least one embodiment, the apparatus may further include a plurality of second vias formed in the second silicon substrate and configured to provide electrical connection to the second circuit structure. The second vias may include: a plurality of second through holes connecting the first primary side and the second primary side of the second silicon substrate; and a second electrically-conductive material filled in the second through holes and in contact with the second circuit structure.

In at least one embodiment, at least some of the second vias may be formed along at least one peripheral side of the second silicon substrate.

In at least one embodiment, at least some of the second vias may be aligned with at least some of the first vias.

In at least one embodiment, the first electrically-conductive material and the second electrically-conductive material may be made of an identical material.

In yet another aspect, an apparatus may include a first semiconductor device. The first semiconductor device may include a first silicon substrate having a first primary side and a second primary side opposite the first primary side. The first primary side of the first silicon substrate may include a first circuit structure disposed thereon. The second primary side of the first silicon substrate may include a plurality of first grooves thereon. At least some of the first grooves may be filled with a first phase-change material. The apparatus may also include a sheet disposed on the second primary side of the first silicon substrate of the first semiconductor device such that the first phase-change material is sealed within the at least some of the first grooves by the first silicon structure and the sheet.

In at least one embodiment, the apparatus may further include a second semiconductor device. The second semiconductor device may include a second silicon substrate having a first primary side and a second primary side opposite the first primary side. The first primary side of the second silicon substrate may include a second circuit structure disposed thereon. The second primary side of the second silicon substrate may include a plurality of second grooves thereon. At least some of the second grooves may be filled with a second phase-change material. The first semiconductor device may be stacked on the second semiconductor device with the first primary side of the first silicon substrate facing the second primary side of the second silicon substrate such that the second phase-change material is sealed within the at least some of the second grooves by the second silicon structure and the first silicon structure.

In at least one embodiment, a portion of at least the first circuit structure or the second circuit structure may be configured to function as a memory unit, a central processing unit, a graphics processing unit, a navigation unit, a communication unit, or a radio frequency unit.

In at least one embodiment, at least the first circuit structure or the second circuit structure may include one or more electrical traces or a semiconductor structure of an integrated circuit.

In at least one embodiment, the first semiconductor device and the second semiconductor device may be bonded by solder bonding or epoxy bonding.

In at least one embodiment, at least the first phase-change material or the second phase-change material may be electrically non-conductive.

In at least one embodiment, at least the first phase-change material or the second phase-change material may include a salt hydrate, an ionic liquid, paraffin, fatty acid, ester, an organic-organic compound, an organic-inorganic compound, or an inorganic-inorganic compound.

In at least one embodiment, the apparatus may further include a plurality of first vias formed in the first silicon substrate and configured to provide electrical connection to the first circuit structure. The first vias may include: a plurality of first through holes connecting the first primary side and the second primary side of the first silicon substrate; and a first electrically-conductive material filled in the first through holes and in contact with the first circuit structure.

In at least one embodiment, at least some of the first vias may be formed along at least one peripheral side of the first silicon substrate.

In at least one embodiment, the apparatus may further include a plurality of second vias formed in the second silicon substrate and configured to provide electrical connection to the second circuit structure. The second vias may include: a plurality of second through holes connecting the first primary side and the second primary side of the second silicon substrate; and a second electrically-conductive material filled in the second through holes and in contact with the second circuit structure.

In at least one embodiment, at least some of the second vias may be formed along at least one peripheral side of the second silicon substrate.

In at least one embodiment, at least some of the second vias may be aligned with at least some of the first vias.

In at least one embodiment, the first electrically-conductive material and the second electrically-conductive material may be made of an identical material.

In at least one embodiment, the apparatus may further include a heat dissipation element at least partially sandwiched between the first semiconductor device and the second semiconductor device.

In at least one embodiment, the heat dissipation element may include at least one component made of copper, silver, aluminum, zinc, silicon, ceramic, carbon-fiber, nanowires, or graphite.

The proposed techniques are further described below in the detailed description section. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

Typically silicon integrated-circuit chips are made from a single crystal silicon wafer in various thicknesses, where the thickness is determined by the wafer size. Silicon wafers are processed to build a circuit on one side of the wafer (referred to as the front side herein) with the other side of the silicon wafer (referred to as the back side herein) thinned out to a few hundred microns due to better thermal behavior and simplistic dicing requirement. Recently three-dimensional die stacking technology for memory integrated-circuit chips has been developed and it requires a compact heat dissipating technology. The present disclosure provides a silicon heat sink structure that is etched on the back side of the wafer, resulting in better thermal conduction and dissipation into the air for the heat generated by the integrated circuit on the silicon. The present disclosure also provides a technology of fabricating a fin structure on an integrated-circuit chip that is normally back-lapped to thin out the back side of the silicon wafer. Rather than being thinned out, the back side of the silicon wafer is etched to form a fin structure to increase the surface area for heat dissipation and better surface finish.

Figure 1:
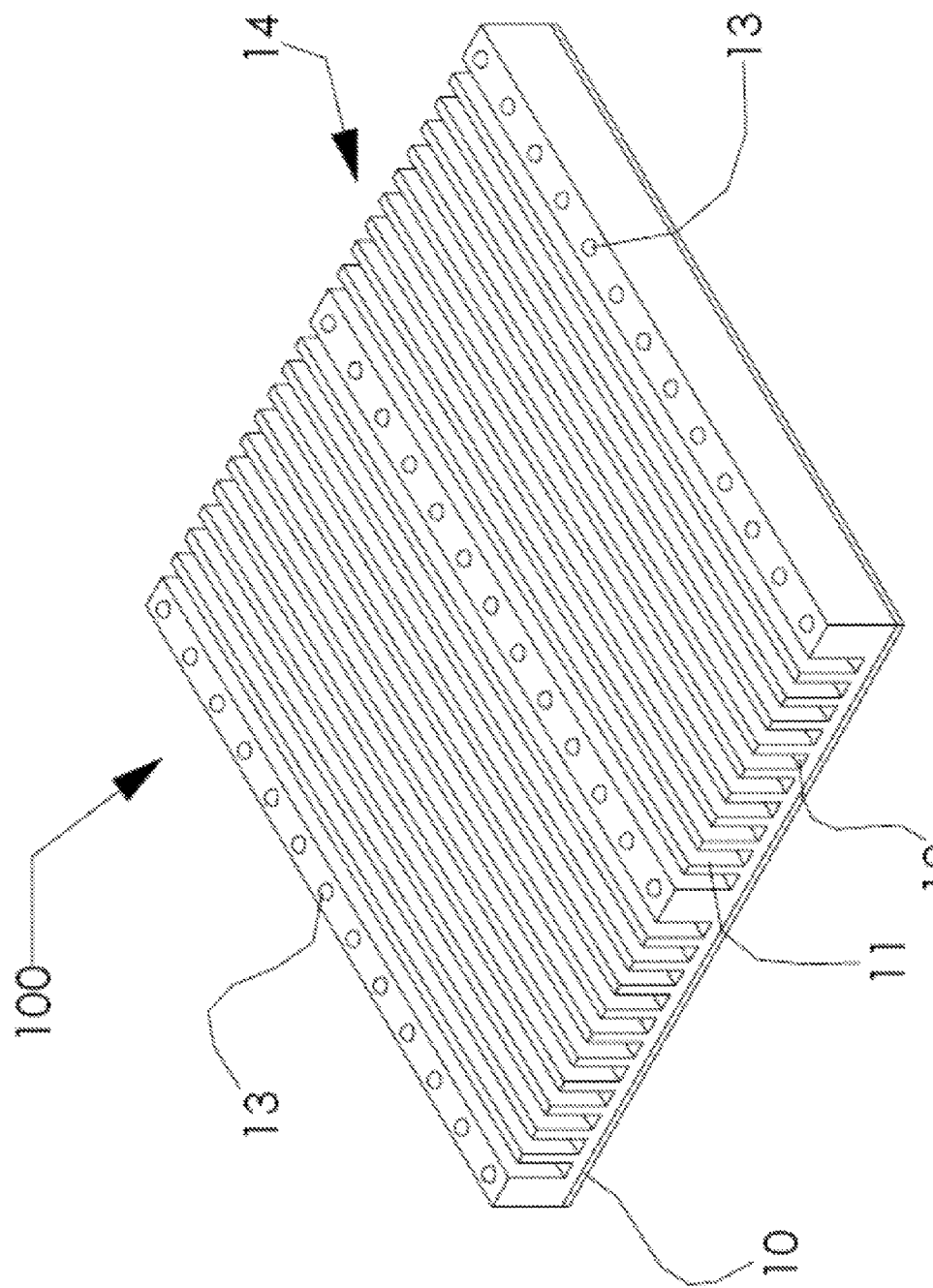
FIG. 1 is a perspective view of a three-dimensional semiconductor device in accordance with an embodiment of the present disclosure.
Figure 2:
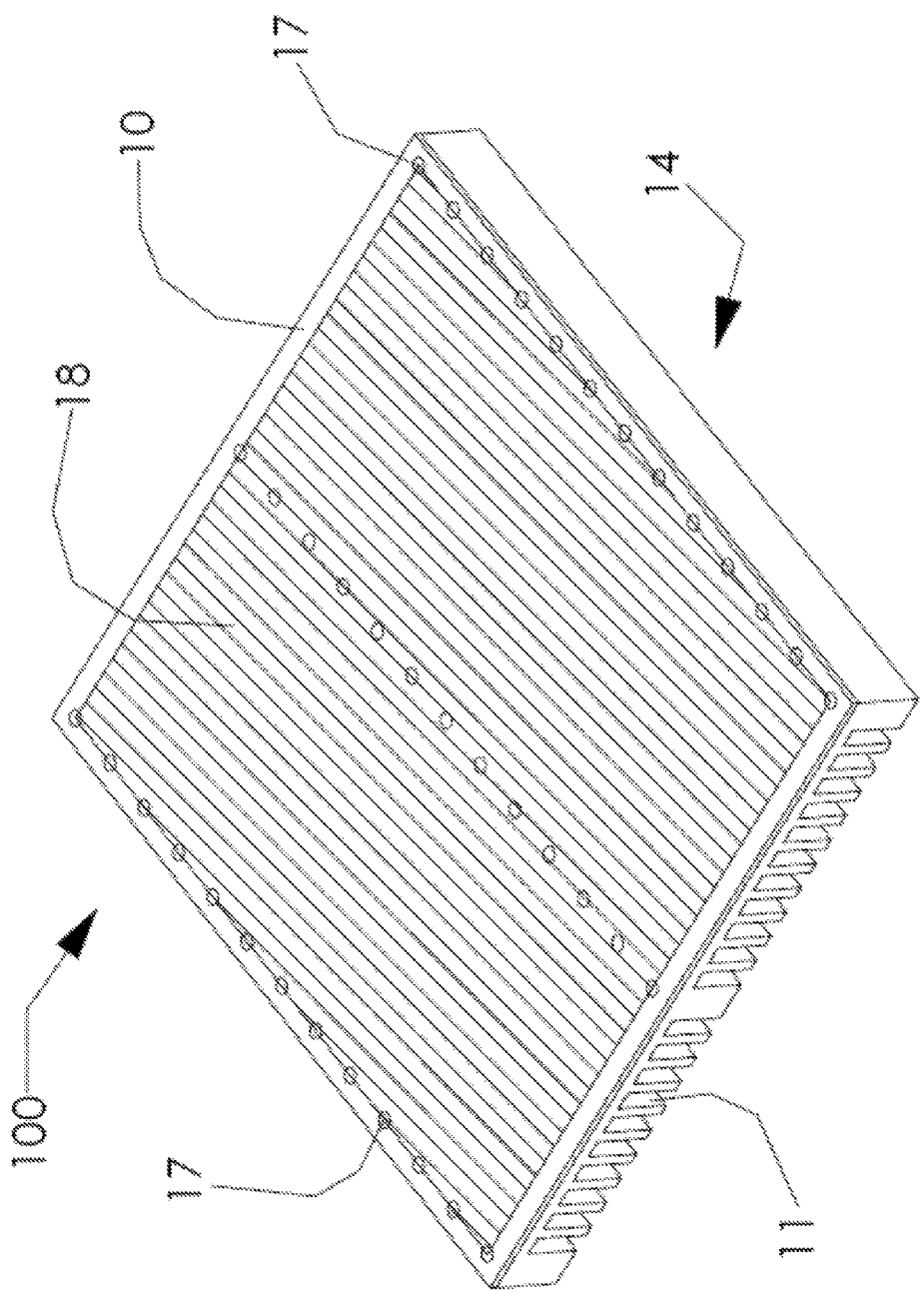
FIG. 2 is another perspective view of the three-dimensional semiconductor device of FIG. 1.
Figure 3:
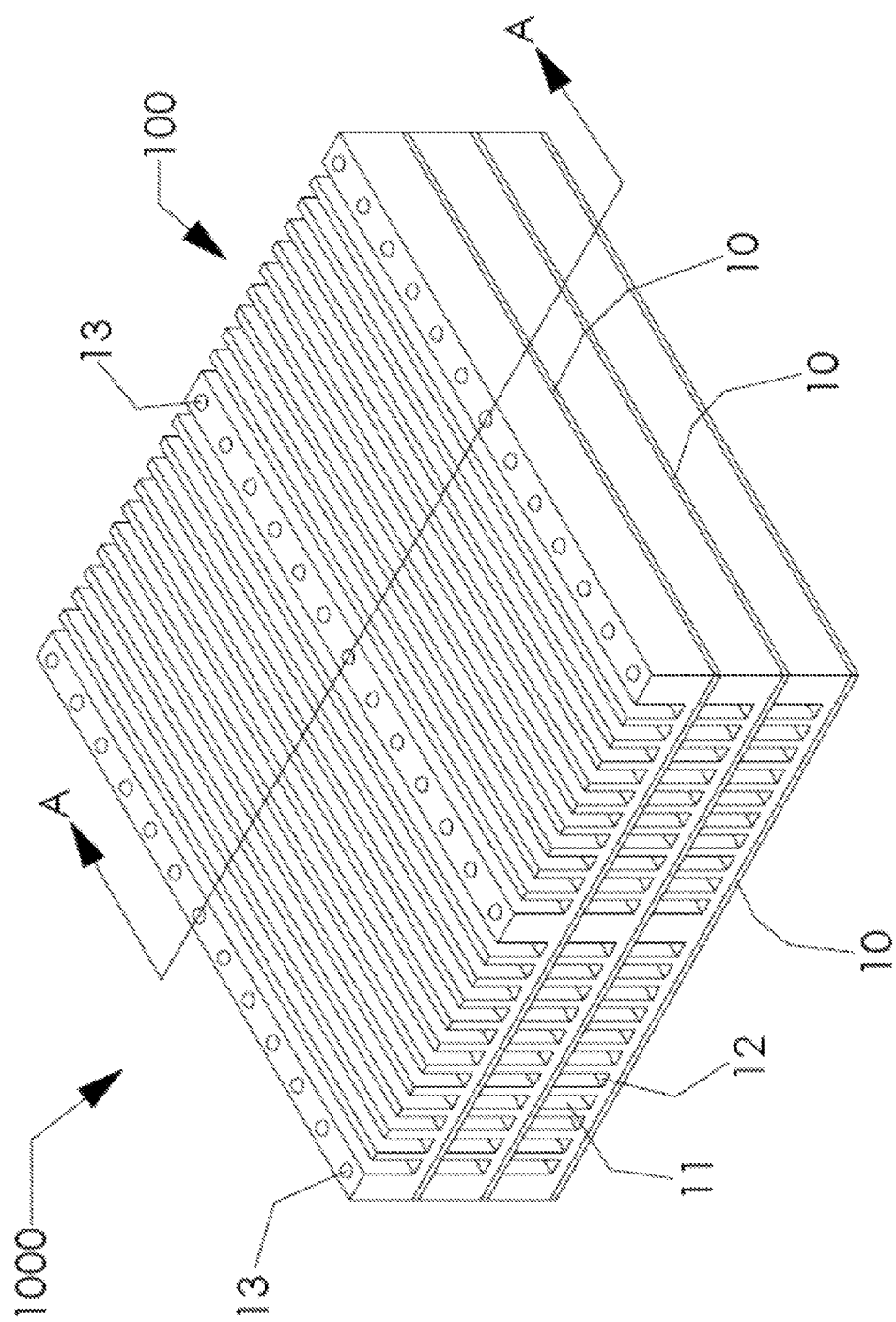
FIG. 3 is a perspective view of an apparatus having multiple three-dimensional semiconductor devices of FIGS. 1 and 2 in accordance with an embodiment of the present disclosure.
Figure 4:
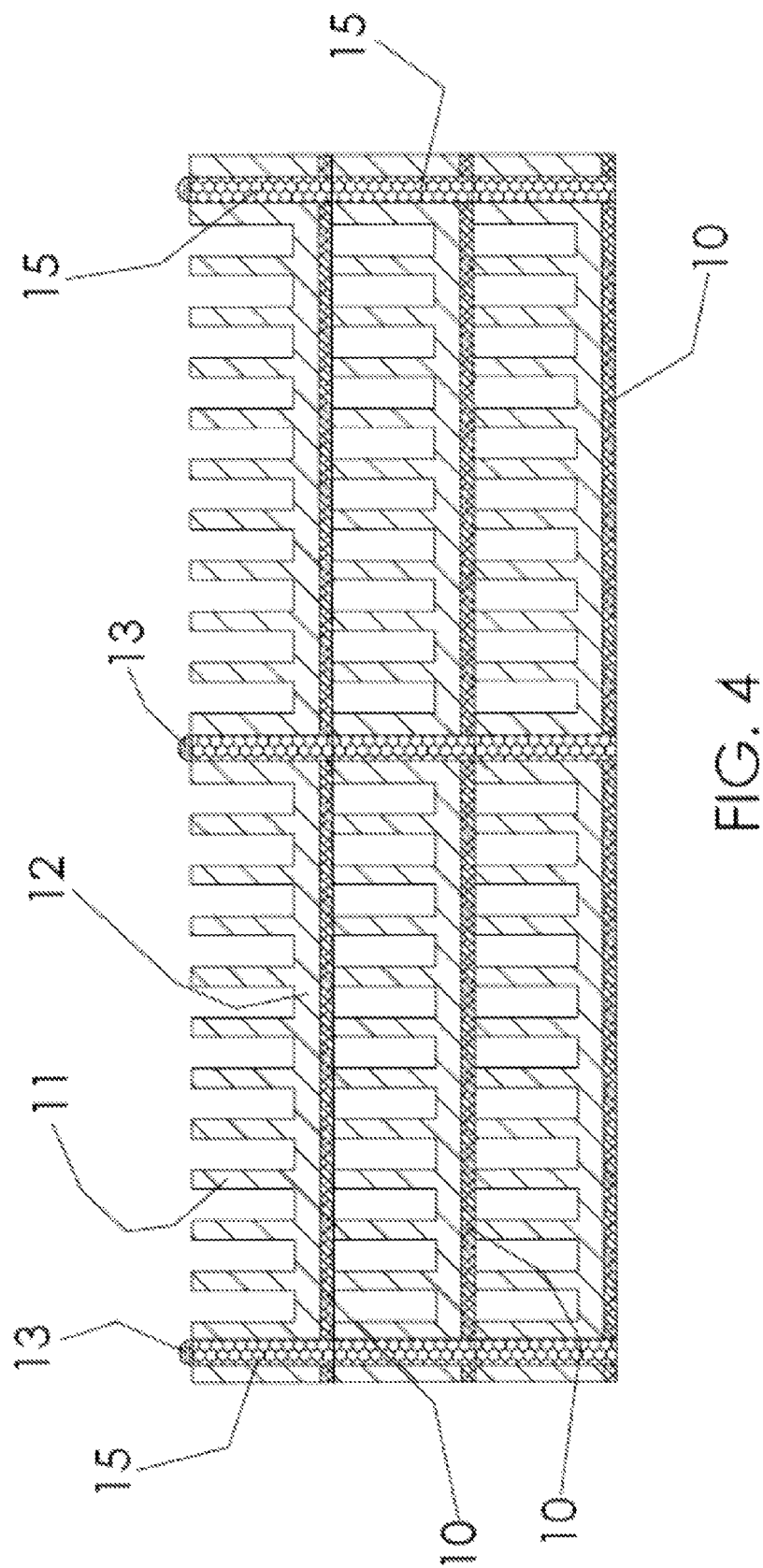
FIG. 4 is a cross-sectional view of the apparatus of FIG. 3.

FIG. 1 illustrates a perspective view, showing the back side, of a three-dimensional semiconductor device 100 in accordance with an embodiment of the present disclosure. FIG. 2 illustrates another perspective view, showing the front side, of the three-dimensional semiconductor device 100. FIG. 3 illustrates a perspective view of an apparatus 1000 having multiple three-dimensional semiconductor devices 100 of FIGS. 1 and 2 in accordance with an embodiment of the present disclosure. FIG. 4 illustrates a cross-sectional view of the apparatus 1000 of FIG. 3.

As shown in FIGS. 1 and 2, the semiconductor device 100 includes a silicon substrate 14. Silicon substrate 14 may be made from, for example, a single-crystal silicon. The front side (herein interchangeably referred to as the first primary side) of the silicon substrate 14 includes a circuit structure 10, which may be an integrated circuit, deposited thereon. At least a portion of the circuit structure 10 may be configured to function as, for example, a memory unit, a central processing unit, a graphics processing unit, a navigation unit, a communication unit, or a radio frequency unit. That is, given the function of the circuit structure 10, the semiconductor device 100 may be a memory chip, a processor, a graphics processor, a wireless or wire-line communication chip, a transmitter chip, a receiver chip, a transceiver chip, a global positioning system (GPS) chip, or lab-on-a-chip, or a multi-functioning chip that performs functions of some or all of the aforementioned chips. In at least one embodiment, the circuit structure 10 may include one or more electrical traces or a semiconductor structure of an integrated circuit, represented by an electrical circuit area 18 in FIG. 2.

The back side (herein interchangeably referred to as the second primary side) of the silicon substrate 14 includes plural fins 11 and plural grooves 12 monolithically formed on the back side of the silicon substrate 14. For instance, the grooves 12 may be etched onto the back side of the silicon structure 14 to form the fin structure of fins 11 and groove 12. The fins 11 and grooves 12 together form a fin structure that functions as an air-cooled heat sink. Given the natural characteristics of silicon, features on the silicon substrate 14 such as fins 11 of the fine structure may be down to 100 μm or less, and the density of the silicon fins 11 can be as large as three to five times compared to metal fins on metallic air-cooled heat sinks.

As shown in FIGS. 1 and 2, silicon substrate 14 includes one or more vias 17 configured to provide electrical connection to the circuit structure 10. The vias 17 may include: a plurality of through holes connecting the front side and the back side of the silicon substrate 14. The vias 17 provide electrical inter-connections between the circuit structure 10 on the front side of the silicon substrate 14 and one or more other circuits or an external power source. In at least one embodiment, electrically-conductive material 15 may be filled in the one or more vias 17 and, additionally, solder bumps 13 may be formed out of the electrically-conductive material 15, e.g., on the back side of the silicon substrate 14 as shown in FIG. 1. Electrically-conductive material 15 facilitates solder bonding, as well as electrical connection through vias 17, of the semiconductor device 100 with another semiconductor device that is similar to the semiconductor device 100 when two or more of semiconductor devices are stacked together to form a three-dimensional high-density chip package. In at least one embodiment, at least some of the vias 17 may be formed along at least one peripheral side of the silicon substrate 14.

As shown in FIGS. 3 and 4, the inventive concept of the present disclosure allow stacking of multiple ones of the semiconductor devices 100 to form a high-density chip package with efficient heat dissipation capability of the monolithic silicon fin structure (comprising of fins 11 and grooves 12) on the back side of the silicon substrate 14 of each semiconductor device 100. Usually, there is not any good solution of fabricating high-density chip packages in three-dimensional structure with heat dissipation structure. In at least one embodiment, the multiple semiconductor devices 100 in apparatus 1000 are solder bonded through the solder bumps of the electrically-conductive material 15 and vias 17. The electrical circuit area 18 of the circuit structure 10 on each semiconductor device 100 in the apparatus 1000 is electrically connected to vias 17 and electrically connected to one or more other electrical circuit area(s) 18 of one or more other semiconductor device(s) 100 in apparatus 1000, or to an external power source, through the solder bumps of the electrically-conductive material 15 and vias 17. The silicon fin structure on the back side of the silicon substrate 14 of each semiconductor device 100 in apparatus 1000 facilitates heat dissipation, or cooling, of the respective electrical area 18 on the front side of the respective silicon substrate 14. This stacking technique with monolithically-formed silicon fin structure on each semiconductor device 100 eliminates at least some of the thermal problems in stacking memory chips, CPU, graphics chips, RF chips and other high-density integrated-circuit chips.

FIG. 4 show a cross-sectional view of apparatus 1000. As shown in FIG. 4, the electrically-conductive material 15 in the vias 17 provide electrical connection for electrical signals, electrical power and grounding between a given electrical circuit area 18 with one or more other electrical circuit area(s) 18, an external power source or ground. Given that each electrical circuit area 18 may be configured to perform one or more respective functions, and that the function(s) of each electrical circuit area 18 may be different from or identical to that of another electrical circuit area 18 of the semiconductor devices 100 of apparatus 1000, apparatus 1000 may be a multi-function multi-chip package or a single-function multi-chip package.

Figure 5:
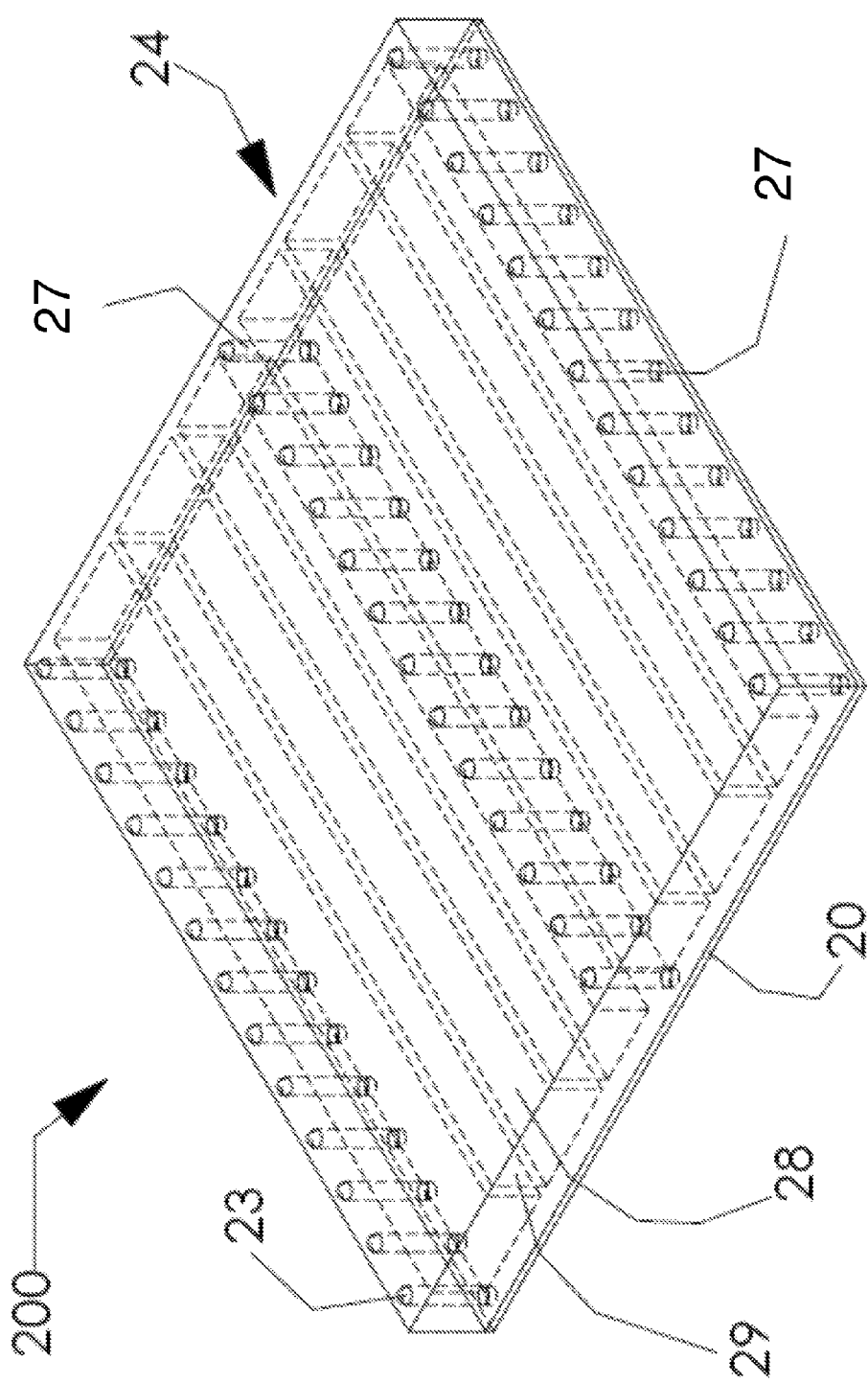
FIG. 5 is a perspective view of a three-dimensional semiconductor device in accordance with another embodiment of the present disclosure.
Figure 6:
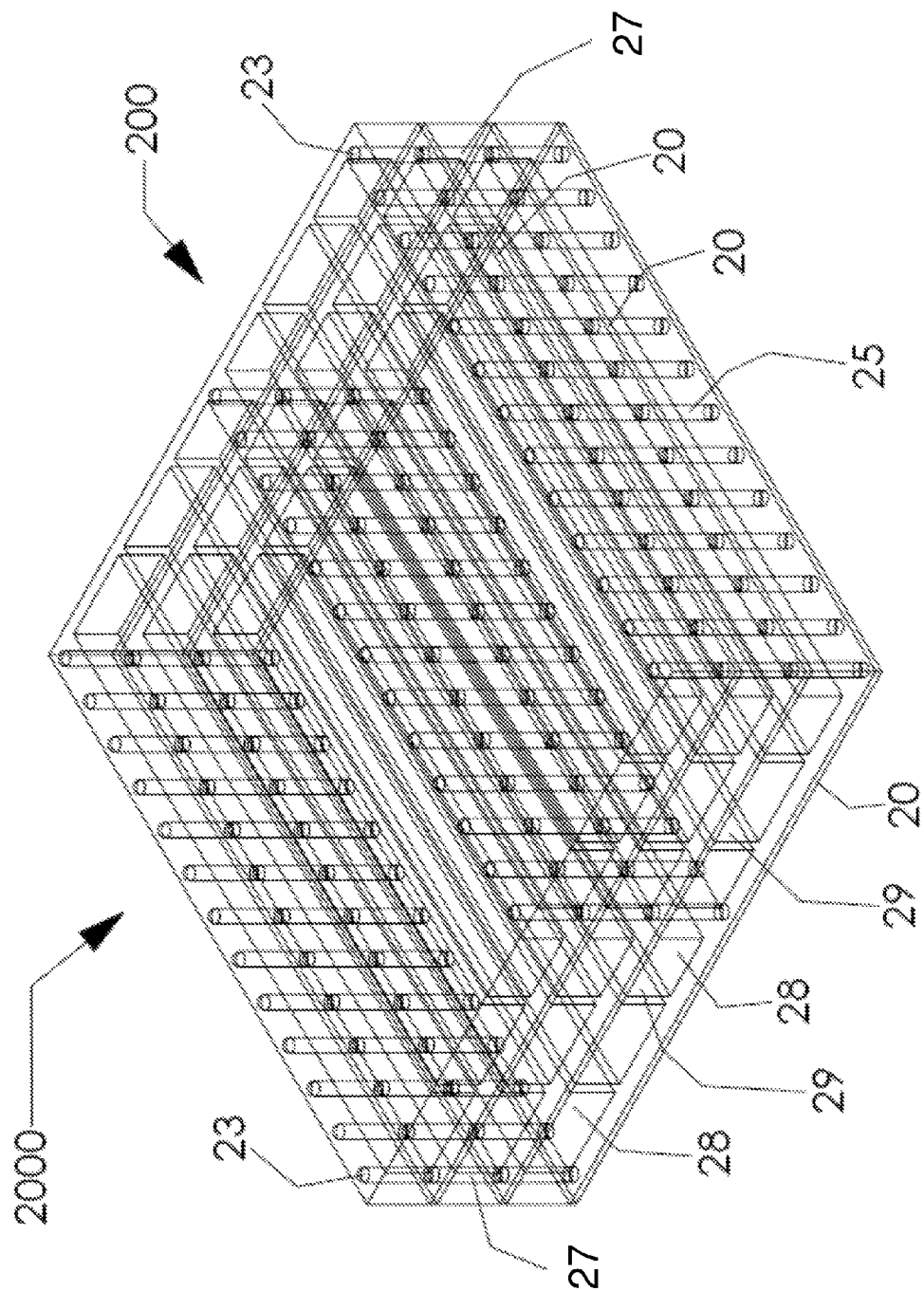
FIG. 6 is a perspective view of an apparatus having multiple three-dimensional semiconductor devices of FIG. 5 in accordance with another embodiment of the present disclosure.
Figure 7:
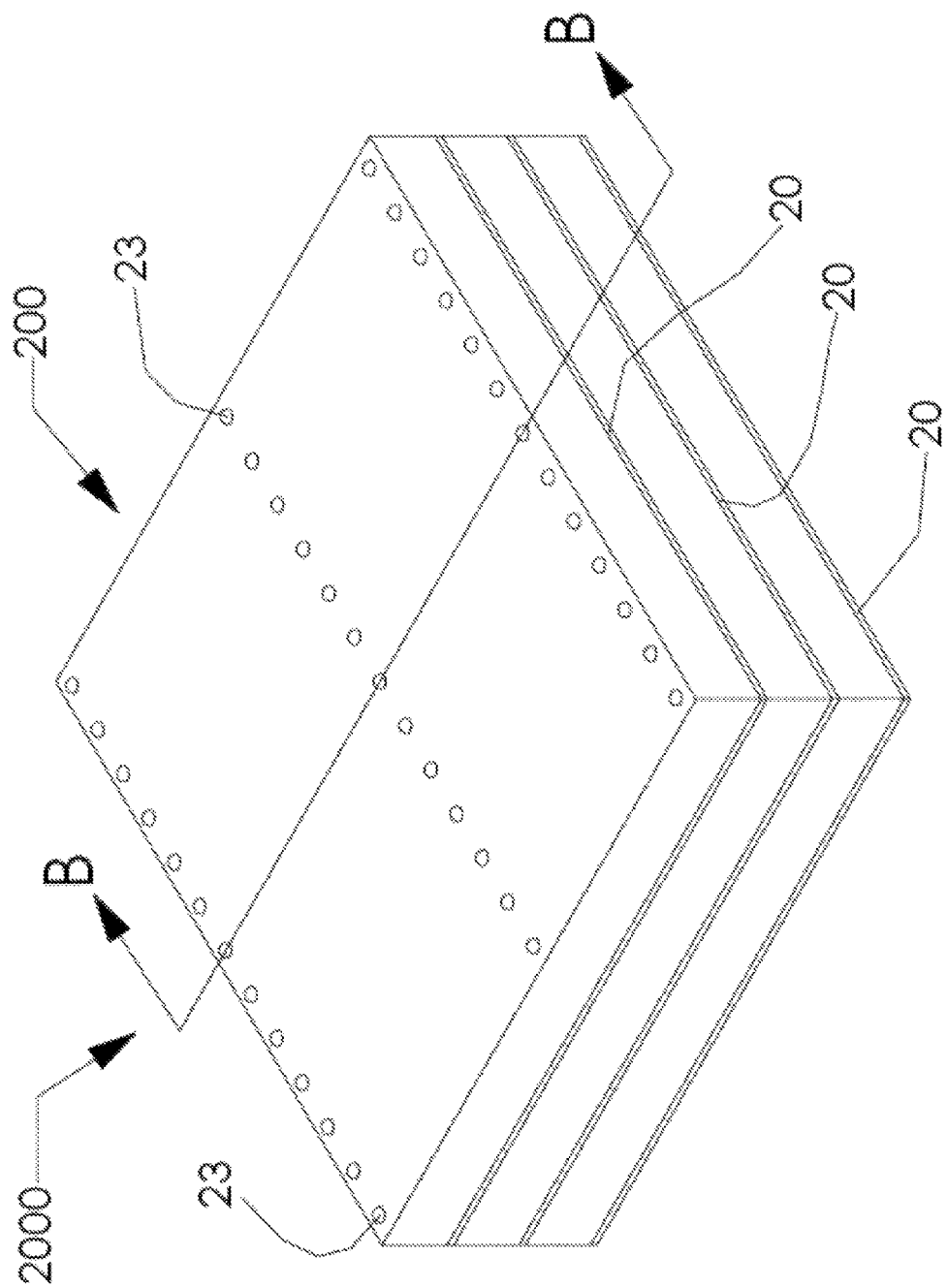
FIG. 7 is another perspective bottom view of the apparatus of FIG. 6.
Figure 8:
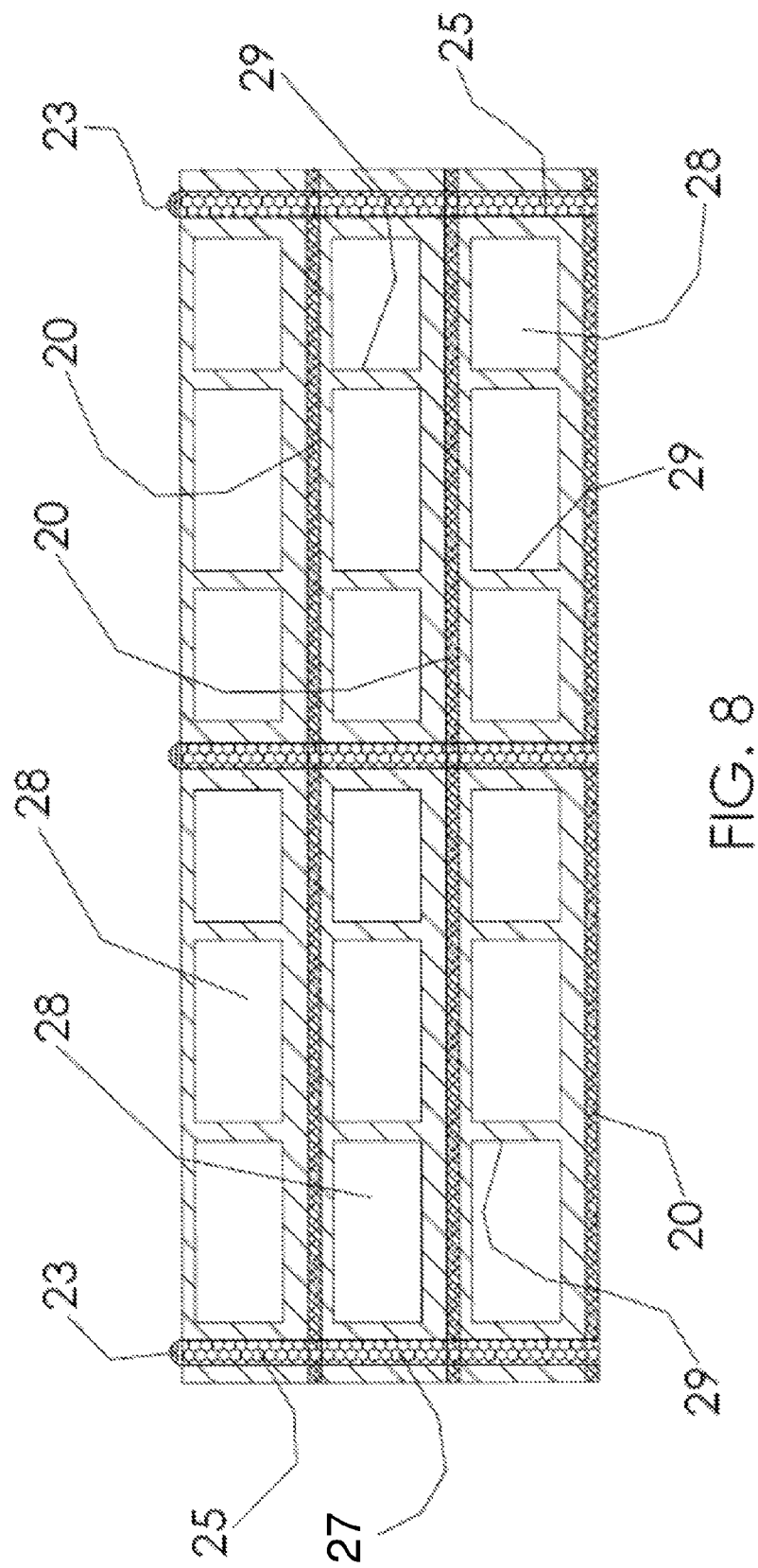
FIG. 8 is a cross-sectional view of the apparatus of FIG. 6.

FIG. 5 illustrates a perspective view of a three-dimensional semiconductor device 200 in accordance with another embodiment of the present disclosure. FIG. 6 illustrates a perspective view of an apparatus 2000 having multiple three-dimensional semiconductor devices 200 of FIG. 5 in accordance with another embodiment of the present disclosure. FIG. 7 illustrates another perspective bottom view of the apparatus 2000 of FIG. 6. FIG. 8 illustrates a cross-sectional view of the apparatus 2000 of FIG. 6.

As shown in FIG. 5, the semiconductor device 200 includes a silicon substrate 24. Silicon substrate 24 may be made from, for example, a single-crystal silicon. The front side (herein interchangeably referred to as the first primary side) of the silicon substrate 24 includes a circuit structure 20, which may be an integrated circuit, deposited thereon. At least a portion of the circuit structure 20 may be configured to function as, for example, a memory unit, a central processing unit, a graphics processing unit, a navigation unit, a communication unit, or a radio frequency unit. That is, given the function of the circuit structure 20, the semiconductor device 200 may be a memory chip, a processor, a graphics processor, a wireless or wire-line communication chip, a transmitter chip, a receiver chip, a transceiver chip, a global positioning system (GPS) chip, or lab-on-a-chip, or a multi-functioning chip that performs functions of some or all of the aforementioned chips. In at least one embodiment, the circuit structure 20 may include one or more electrical traces or a semiconductor structure of an integrated circuit.

The back side (herein interchangeably referred to as the second primary side) of the silicon substrate 24 includes plural fins 29 and plural grooves monolithically formed on the back side of the silicon substrate 24. For instance, the grooves may be etched onto the back side of the silicon structure 24 to form the fin structure of fins 29 and groove. A sealing layer may be bonded to the back side of the silicon substrate 24 to form plural voids 28 with the fins 29 and grooves. A phase-change material (PCM) is partially or completely filled in the voids 28 and sealed therein by the silicon substrate 24 and the sealing layer. That is, the voids 28 are PCM containers. The silicon fins 29 serve as partitions and add heat-spreading function of the PCM since the PCM in general tends to have a poor thermal conduction property. Accordingly, the semiconductor device 200 has an advantage of storing heat generated by the circuit structure 20, and thus is ideal for compact and/or mobile/portable applications such as mobile phones, tablet computers, laptop computers and the like.

As shown in FIG. 5, silicon substrate 24 includes one or more vias 27 configured to provide electrical connection to the circuit structure 20. The vias 27 may include: a plurality of through holes connecting the front side and the back side of the silicon substrate 24. The vias 27 provide electrical inter-connections between the circuit structure 20 on the front side of the silicon substrate 24 and one or more other circuits or an external power source. In at least one embodiment, electrically-conductive material 25 may be filled in the one or more vias 27 and, additionally, solder bumps 23 may be formed out of the electrically-conductive material 25, e.g., on the back side of the silicon substrate 24 as shown in FIG. 5. Electrically-conductive material 25 facilitates solder bonding, as well as electrical connection through vias 27, of the semiconductor device 200 with another semiconductor device that is similar to the semiconductor device 200 when two or more of semiconductor devices are stacked together to form a three-dimensional high-density chip package. In at least one embodiment, at least some of the vias 27 may be formed along at least one peripheral side of the silicon substrate 24.

As shown in FIGS. 6-8, the inventive concept of the present disclosure allow stacking of multiple ones of the semiconductor devices 200 to form a high-density chip package with efficient heat storage and dissipation capability of the PCM in the PCM containers (or voids 28) on the back side of the silicon substrate 24 of each semiconductor device 200. In at least one embodiment, the multiple semiconductor devices 200 in apparatus 2000 are solder bonded through the solder bumps of the electrically-conductive material 25 and vias 27. The circuit structure 20 on each semiconductor device 200 in the apparatus 2000 is electrically connected to vias 27 and electrically connected to one or more other circuit structure(s) 20 of one or more other semiconductor device(s) 200 in apparatus 2000, or to an external power source, through the solder bumps of the electrically-conductive material 25 and vias 27. The thermal reservoir on the back side of the silicon substrate 24 of each semiconductor device 200 in apparatus 2000, formed by the silicon fin structure of fins 29, voids 28, sealing layer, and the PCM contained therein, facilitates heat dissipation, or cooling, of the respective circuit structure 20 on the front side of the respective silicon substrate 24. This stacking technique with monolithically-formed silicon fin structure on each semiconductor device 200 eliminates at least some of the thermal problems in stacking memory chips, CPU, graphics chips, RF chips and other high-density integrated-circuit chips.

FIG. 8 show a cross-sectional view of apparatus 3000. As shown in FIG. 8, the electrically-conductive material 25 in the vias 27 provide electrical connection for electrical signals, electrical power and grounding between a given circuit structure 20 with one or more other circuit structure(s) 20, an external power source or ground. Given that each circuit structure 20 may be configured to perform one or more respective functions, and that the function(s) of each circuit structure 20 may be different from or identical to that of another circuit structure 20 of the semiconductor devices 200 of apparatus 2000, apparatus 1000 may be a multi-function multi-chip package or a single-function multi-chip package.

Figure 9:
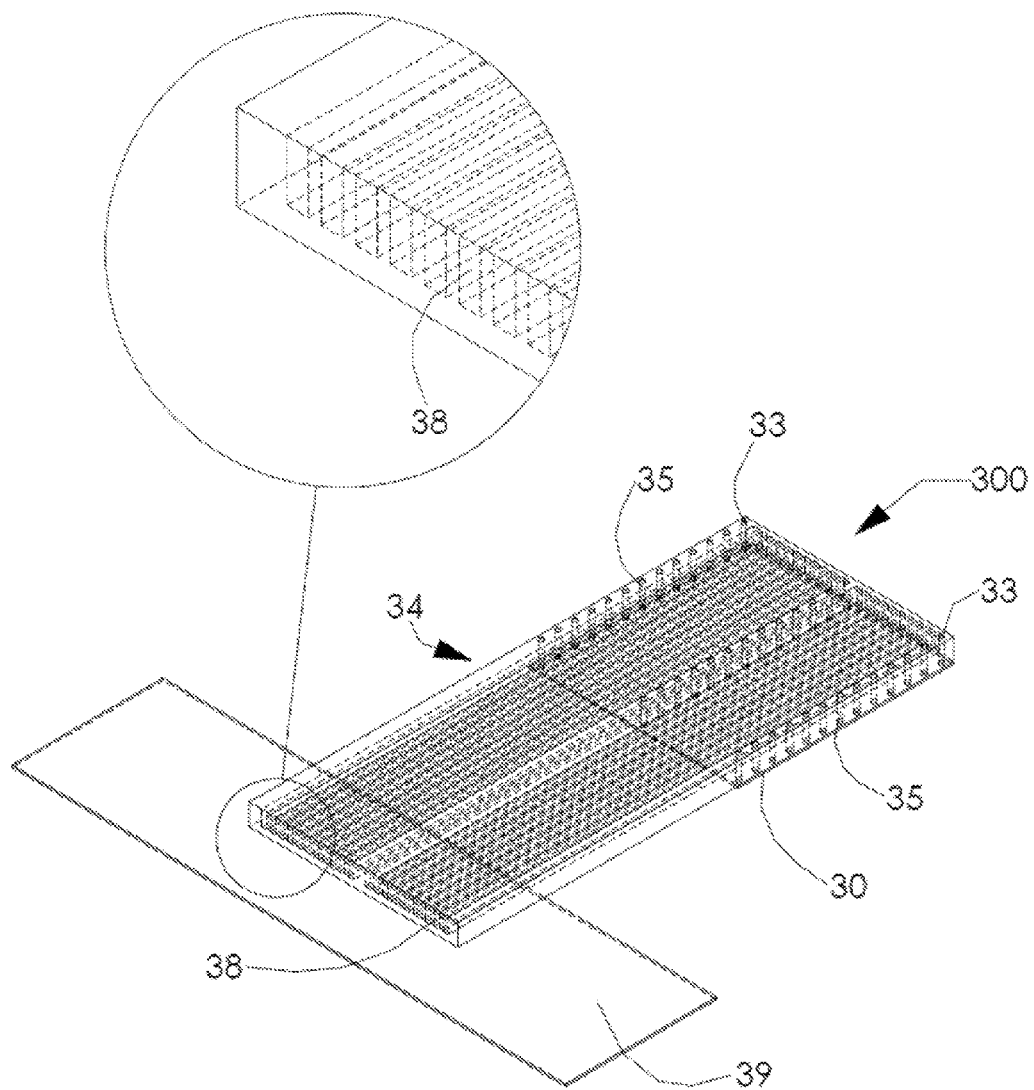
FIG. 9 is a perspective view of a three-dimensional semiconductor device in accordance with a further embodiment of the present disclosure.
Figure 10:
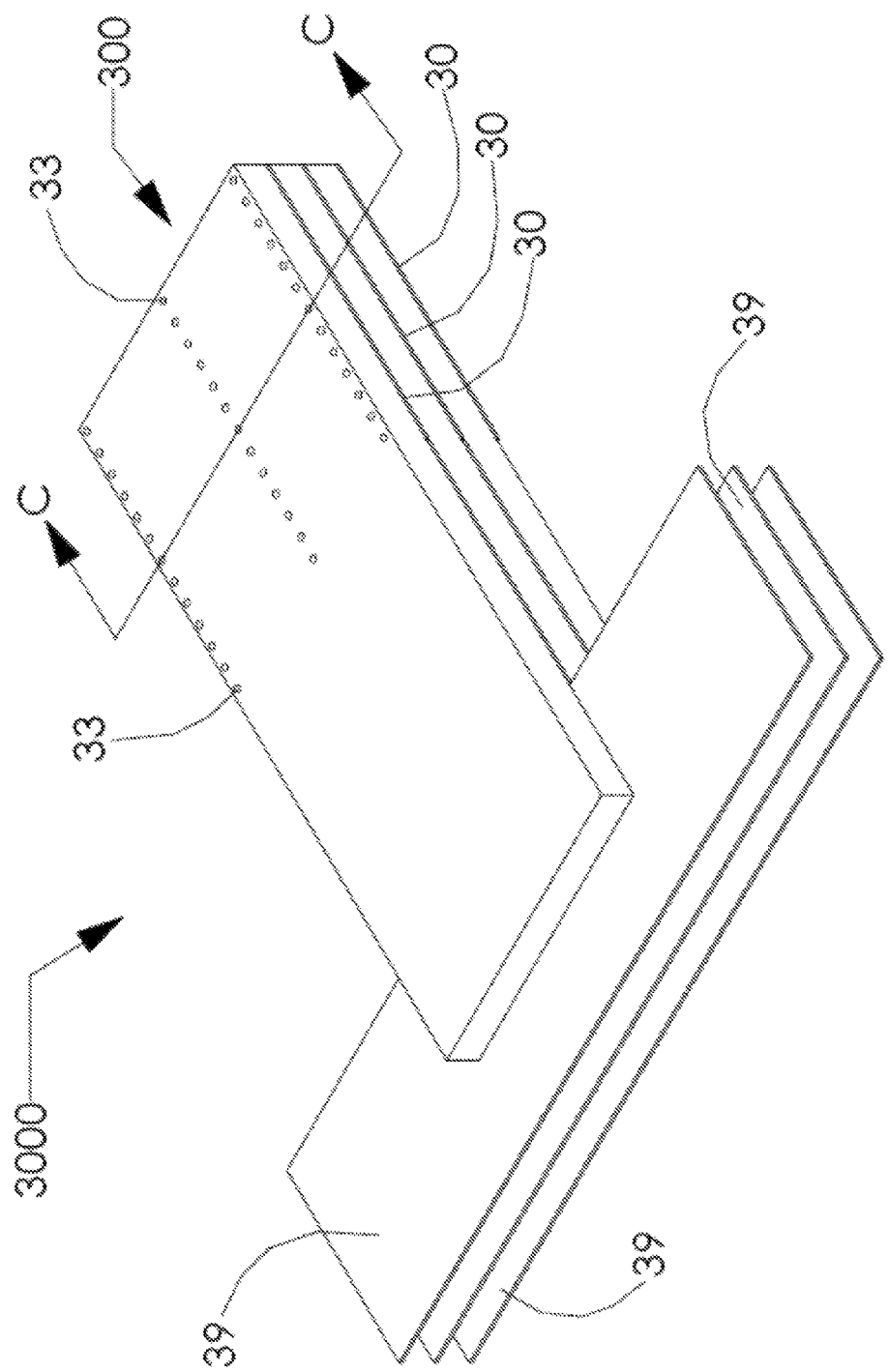
FIG. 10 is another perspective view of the apparatus having multiple three-dimensional semiconductor devices of FIG. 9.
Figure 11:
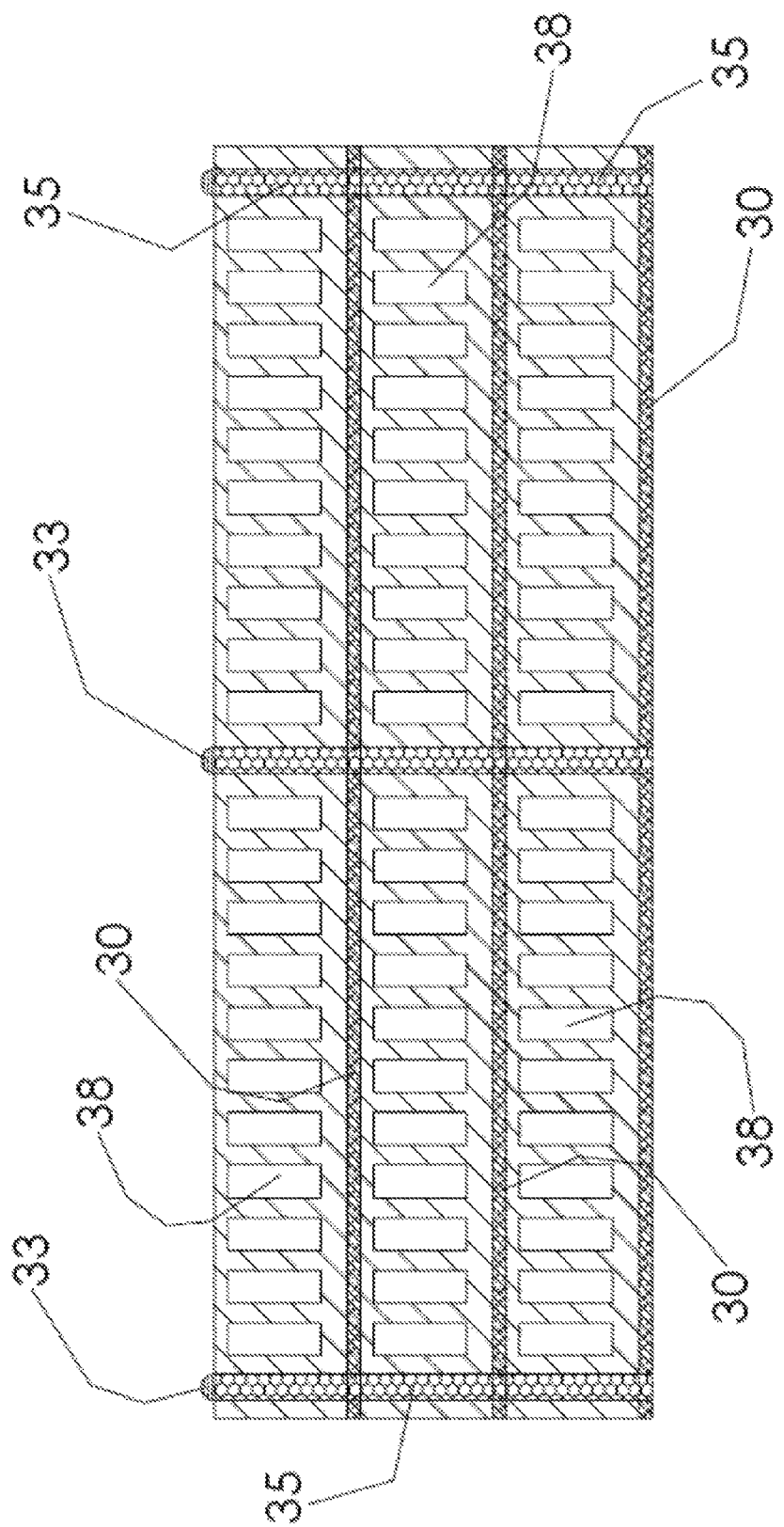
FIG. 11 is a cross-sectional view of the apparatus of FIG. 10.

FIG. 9 illustrates a perspective view of a three-dimensional semiconductor device 300 in accordance with a further embodiment of the present disclosure. FIG. 10 illustrates another perspective view of an apparatus 3000 having multiple three-dimensional semiconductor devices 300 of FIG. 9. FIG. 11 illustrates a cross-sectional view of the apparatus 3000 of FIG. 10.

Semiconductor device 300 is a concept of heat pipe with a heat spreader 39 attached at the end of a silicon structure of 34. Semiconductor device 300 is similar to semiconductor device 200. Thus, in the interest of brevity, a detailed description of semiconductor device 300 is not provided and the following description focuses on differences between semiconductor device 300 and semiconductor device 200.

Semiconductor device 300 includes a silicon structure 34 with a circuit structure deposited on the front side of the silicon structure 34 and a thermal reservoir formed on the back side of the silicon structure 34. The thermal reservoir is formed by a sealing layer and voids that are formed by plural fins and grooves and the sealing layer. Semiconductor device 300 includes plural vias 37 filled with electrically-conductive material 35 and topped with solder bumps 33. Semiconductor device 300 differs from semiconductor device 200 mainly in that semiconductor device 300 is elongated in one dimension for heat pipe purpose. A heat spreader 39 is attached to the elongated portion of the semiconductor device 300. Heat spreader 39 may be made of a metallic material such as copper, aluminum, gold, silver, zinc, or an alloy thereof. Alternatively, heat spreader 39 may be made of ceramic or silicon. Apparatus 3000 includes multiple ones of semiconductor devices 300 stacked together with multiple heat spreaders 39 sandwiched between every two adjacent semiconductor devices 300.

Heat generated by the circuit structure 30 in each semiconductor device 300 is transferred by the PCM contained in the thermal reservoir, whether in the form of liquid or gas, to the heat spreader 39 and the heat is dissipated into air or transferred to other large thermal reservoir. This structure will increase heat dissipation rate in proportion to the surface area of the heat spreader 39.

In view of the above detailed description, a number of embodiments and variations thereof may be conceived. The following description pertains to a select number of such embodiments.

In one aspect, a device may include a silicon substrate. The silicon substrate may have a first primary side and a second primary side opposite the first primary side. The first primary side may include a circuit structure disposed thereon. The second primary side may include a plurality of fins monolithically formed thereon.

In at least one embodiment, at least a portion of the circuit structure may be configured to function as a memory unit, a central processing unit, a graphics processing unit, a navigation unit, a communication unit, or a radio frequency unit.

In at least one embodiment, the circuit structure may include one or more electrical traces or a semiconductor structure of an integrated circuit.

In at least one embodiment, the device may further include a plurality of vias formed in the silicon substrate and configured to provide electrical connection to the circuit structure. The vias may include: a plurality of through holes connecting the first primary side and the second primary side of the silicon substrate; and an electrically-conductive material filled in the through holes and in contact with the circuit structure.

In at least one embodiment, at least some of the vias may be formed along at least one peripheral side of the silicon substrate.

In another aspect, an apparatus may include a first semiconductor device and a second semiconductor device. The first semiconductor device may include a first silicon substrate having a first primary side and a second primary side opposite the first primary side. The first primary side of the first silicon substrate may include a first circuit structure disposed thereon. The second primary side of the first silicon substrate may include a plurality of first fins monolithically formed thereon. The second semiconductor device may include a second silicon substrate having a first primary side and a second primary side opposite the first primary side. The first primary side of the second silicon substrate may include a second circuit structure disposed thereon. The second primary side of the second silicon substrate may include a plurality of second fins monolithically formed thereon. The first semiconductor device may be stacked on the second semiconductor device with the first primary side of the first silicon substrate facing the second primary side of the second silicon substrate.

In at least one embodiment, a portion of at least the first circuit structure or the second circuit structure may be configured to function as a memory unit, a central processing unit, a graphics processing unit, a navigation unit, a communication unit, or a radio frequency unit.

In at least one embodiment, at least the first circuit structure or the second circuit structure may include one or more electrical traces or a semiconductor structure of an integrated circuit.

In at least one embodiment, the first semiconductor device and the second semiconductor device may be bonded by solder bonding or epoxy bonding.

In at least one embodiment, the apparatus may further include a plurality of first vias formed in the first silicon substrate and configured to provide electrical connection to the first circuit structure. The first vias may include: a plurality of first through holes connecting the first primary side and the second primary side of the first silicon substrate; and a first electrically-conductive material filled in the first through holes and in contact with the first circuit structure.

In at least one embodiment, at least some of the first vias may be formed along at least one peripheral side of the first silicon substrate.

In at least one embodiment, the apparatus may further include a plurality of second vias formed in the second silicon substrate and configured to provide electrical connection to the second circuit structure. The second vias may include: a plurality of second through holes connecting the first primary side and the second primary side of the second silicon substrate; and a second electrically-conductive material filled in the second through holes and in contact with the second circuit structure.

In at least one embodiment, at least some of the second vias may be formed along at least one peripheral side of the second silicon substrate.

In at least one embodiment, at least some of the second vias may be aligned with at least some of the first vias.

In at least one embodiment, the first electrically-conductive material and the second electrically-conductive material may be made of an identical material.

In yet another aspect, an apparatus may include a first semiconductor device. The first semiconductor device may include a first silicon substrate having a first primary side and a second primary side opposite the first primary side. The first primary side of the first silicon substrate may include a first circuit structure disposed thereon. The second primary side of the first silicon substrate may include a plurality of first grooves thereon. At least some of the first grooves may be filled with a first phase-change material. The apparatus may also include a sheet disposed on the second primary side of the first silicon substrate of the first semiconductor device such that the first phase-change material is sealed within the at least some of the first grooves by the first silicon structure and the sheet.

In at least one embodiment, the apparatus may further include a second semiconductor device. The second semiconductor device may include a second silicon substrate having a first primary side and a second primary side opposite the first primary side. The first primary side of the second silicon substrate may include a second circuit structure disposed thereon. The second primary side of the second silicon substrate may include a plurality of second grooves thereon. At least some of the second grooves may be filled with a second phase-change material. The first semiconductor device may be stacked on the second semiconductor device with the first primary side of the first silicon substrate facing the second primary side of the second silicon substrate such that the second phase-change material is sealed within the at least some of the second grooves by the second silicon structure and the first silicon structure.

In at least one embodiment, a portion of at least the first circuit structure or the second circuit structure may be configured to function as a memory unit, a central processing unit, a graphics processing unit, a navigation unit, a communication unit, or a radio frequency unit.

In at least one embodiment, at least the first circuit structure or the second circuit structure may include one or more electrical traces or a semiconductor structure of an integrated circuit.

In at least one embodiment, the first semiconductor device and the second semiconductor device may be bonded by solder bonding or epoxy bonding.

In at least one embodiment, at least the first phase-change material or the second phase-change material may be electrically non-conductive.

In at least one embodiment, at least the first phase-change material or the second phase-change material may include a salt hydrate, an ionic liquid, paraffin, fatty acid, ester, an organic-organic compound, an organic-inorganic compound, or an inorganic-inorganic compound.

In at least one embodiment, the apparatus may further include a plurality of first vias formed in the first silicon substrate and configured to provide electrical connection to the first circuit structure. The first vias may include: a plurality of first through holes connecting the first primary side and the second primary side of the first silicon substrate; and a first electrically-conductive material filled in the first through holes and in contact with the first circuit structure.

In at least one embodiment, at least some of the first vias may be formed along at least one peripheral side of the first silicon substrate.

In at least one embodiment, the apparatus may further include a plurality of second vias formed in the second silicon substrate and configured to provide electrical connection to the second circuit structure. The second vias may include: a plurality of second through holes connecting the first primary side and the second primary side of the second silicon substrate; and a second electrically-conductive material filled in the second through holes and in contact with the second circuit structure.

In at least one embodiment, at least some of the second vias may be formed along at least one peripheral side of the second silicon substrate.

In at least one embodiment, at least some of the second vias may be aligned with at least some of the first vias.

In at least one embodiment, the first electrically-conductive material and the second electrically-conductive material may be made of an identical material.

In at least one embodiment, the apparatus may further include a heat dissipation element at least partially sandwiched between the first semiconductor device and the second semiconductor device.

In at least one embodiment, the heat dissipation element may include at least one component made of copper, silver, aluminum, zinc, silicon, ceramic, carbon-fiber, nanowires, or graphite.

Exemplary Applications

Any of the above-described three-dimensional semiconductor devices and apparatuses, and any variations thereof, may be implemented in a portable electronics apparatus. For example, a three-dimensional semiconductor device or apparatus as described above may be used in a portable electronics apparatus such as a tablet computer (e.g., iPad by Apple of Cupertino, Calif.), hand-held mobile communication device (e.g., iPhone by Apple of Cupertino, Calif.), notebook/laptop computer, or any suitable hand-held portable device.

Additionally, any of the above-described three-dimensional semiconductor devices and apparatuses, and any variations thereof, may be implemented in a non-portable electronics apparatus. For example, a three-dimensional semiconductor device or apparatus as described above may be used in a desktop computer, server, network node such as a router, switch, gateway or the like, etc.

Additional and Alternative Implementation Notes

The above-described embodiments pertain to a technique, design, scheme, device and mechanism for isolation of thermal ground for multiple heat-generating devices on a substrate. Although the embodiments have been described in language specific to certain applications, it is to be understood that the appended claims are not necessarily limited to the specific features or applications described herein. Rather, the specific features and applications are disclosed as example forms of implementing such techniques.

In the above description of example implementations, for purposes of explanation, specific numbers, materials configurations, and other details are set forth in order to better explain the invention, as claimed. However, it will be apparent to one skilled in the art that the claimed invention may be practiced using different details than the example ones described herein. In other instances, well-known features are omitted or simplified to clarify the description of the example implementations.

The described embodiments are intended to be primarily examples. The described embodiments are not meant to limit the scope of the appended claims. Rather, the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

What is claimed is:

1. An apparatus, comprising:
 a first semiconductor device, comprising:
  a one-piece first silicon substrate having a first primary side and a second primary side opposite the first primary side, the first primary side of the first silicon substrate including a first circuit structure thereon, the second primary side of the first silicon substrate including a plurality of fins monolithically formed thereon that define a plurality of first grooves, at least some of the first grooves filled with a first phase-change material; and a sheet disposed on the fins on the second primary side of the first silicon substrate of the first semiconductor device such that the first phase-change material is sealed within the at least some of the first grooves by the first silicon structure and the sheet, wherein the first primary side is electrically connected to the second primary side through one or more of the fins.

2. The apparatus of claim 1, wherein a portion of at least the first circuit structure is configured to function as a memory unit, a central processing unit, a graphics processing unit, a navigation unit, a communication unit, or a radio frequency unit.

3. The apparatus of claim 1, wherein at least the first circuit structure comprises one or more electrical traces or a semiconductor structure of an integrated circuit.

4. The apparatus of claim 1, further comprising:
a second semiconductor device, comprising:
  a second silicon substrate having a first primary side and a second primary side opposite the first primary side, the first primary side of the second silicon substrate including a second circuit structure disposed thereon, the second primary side of the second silicon substrate including a plurality of second grooves thereon, at least some of the second grooves filled with a second phase-change material,
wherein the first semiconductor device is stacked on the second semiconductor device with the first primary side of the first silicon substrate facing the second primary side of the second silicon substrate such that the second phase-change material is sealed within the at least some of the second grooves by the second silicon structure and the first silicon structure.

5. The apparatus of claim 4, wherein the first semiconductor device and the second semiconductor device are bonded by solder bonding or epoxy bonding.

6. The apparatus of claim 4, wherein at least the first phase-change material or the second phase-change material is electrically non-conductive.

7. The apparatus of claim 4, wherein at least the first phase-change material or the second phase-change material comprises a salt hydrate, an ionic liquid, paraffin, fatty acid, ester, an organic-organic compound, an organic-inorganic compound, or an inorganic-inorganic compound.

8. The apparatus of claim 4, further comprising:
a plurality of first vias formed in the first silicon substrate and configured to provide electrical connection to the first circuit structure and to provide electrical connection between the first primary side and the second primary side of the first silicon substrate, the first vias comprising:
  a plurality of first through holes connecting the first primary side and the second primary side of the first silicon substrate; and
  a first electrically-conductive material filled in the first through holes and in contact with the first circuit structure.

9. The apparatus of claim 8, wherein at least some of the first vias are formed along at least one peripheral side of the first silicon substrate.

10. The apparatus of claim 8, further comprising:
a plurality of second vias formed in the second silicon substrate and configured to provide electrical connection to the second circuit structure, the second vias comprising:
  a plurality of second through holes connecting the first primary side and the second primary side of the second silicon substrate; and
  a second electrically-conductive material filled in the second through holes and in contact with the second circuit structure.

11. The apparatus of claim 10, wherein at least some of the second vias are formed along at least one peripheral side of the second silicon substrate.

12. The apparatus of claim 10, wherein at least some of the second vias are aligned with at least some of the first vias.

13. The apparatus of claim 10, wherein the first electrically-conductive material and the second electrically-conductive material are made of an identical material.

14. The apparatus of claim 4, further comprising:
a heat dissipation element at least partially sandwiched between the first semiconductor device and the second semiconductor device.

15. The apparatus of claim 14, wherein the heat dissipation element comprises at least one component made of copper, silver, aluminum, zinc, silicon, ceramic, carbon-fiber, nanowires, or graphite.

* * * * *